(12) United States Patent
Maxwell et al.

(10) Patent No.: US 6,239,607 B1
(45) Date of Patent: May 29, 2001

(54) SIMULATION-BASED METHOD FOR ESTIMATING LEAKAGE CURRENTS IN DEFECT-FREE INTEGRATED CIRCUITS

(75) Inventors: Peter Maxwell, Sunnyvale, CA (US); Jeff Rearick, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/174,501

(22) Filed: Oct. 16, 1998

(51) Int. Cl.$^7$ .............................. G01R 31/26; G01R 1/04; A47C 27/08; A47C 17/00
(52) U.S. Cl. .................. 324/765; 324/158.1; 702/130; 714/733
(58) Field of Search ............................. 702/130; 324/765, 324/158.1; 714/733

(56) References Cited

U.S. PATENT DOCUMENTS

| | | | |
|---|---|---|---|
| 5,371,457 | * 12/1994 | Lipp | 324/158 |
| 5,392,293 | * 2/1995 | Hsue | 324/765 |
| 5,420,522 | * 5/1995 | Smayling | 324/765 |
| 5,459,737 | * 10/1995 | Andrews | 714/733 |
| 5,519,333 | * 5/1996 | Righter | 324/765 |
| 5,519,335 | * 5/1996 | Thomas | 324/765 |
| 5,670,890 | * 9/1997 | Colwell et al. | 324/765 |
| 5,731,700 | * 3/1998 | McDonald | 324/158 |
| 5,773,990 | * 6/1998 | Wilstrup et al. | 324/765 |
| 5,914,615 | * 6/1999 | Chess | 324/765 |
| 5,915,232 | * 6/1999 | McMinn | 702/130 |
| 6,031,386 | * 2/2000 | Cole et al. | 324/765 |

OTHER PUBLICATIONS

Randal E. Bryant—"A Switch–Level Model and Simulator for MOS Digital Systems", IEEE Transactions on Computers, vol. C–33, No. 2, Feb. 1984; pp. 160–177.

P. C. Maxwell and J. R. Rearick, Integrated Circuit Business Division, Hewlett–Packard Company; A Simulation–Based Method for Estimating Defect–Free IDDQ; IEEE International Workshop on IDDQ Testing, Nov. 5–6, 1997, Washington, D.C.

* cited by examiner

*Primary Examiner*—Glenn W. Brown
*Assistant Examiner*—Wasseem H. Hamdan

(57) ABSTRACT

A method for operating a data processing system to provide an estimate of the leakage current expected from an integrated circuit having a known test vector applied thereto. The method generates a graph having a first node connected to a terminal maintained at a first power supply potential and a second node connected to a terminal maintained at a second power supply potential, the first and second power supply potentials having a potential difference of $V_{DD}$. Each edge represents a source-drain connected transistor connected between two nodes as a switch having a resistance that depends on whether the transistor is "on" or "off" when the test signals are present. Each node in the graph is assigned a value of 0 or 1, together with the strength of that value. The assignment process also verifies that the circuit is in a valid static state. A leakage current estimate is generated for each path connecting the first and second nodes, and estimates are combined to arrive at the estimate for the integrated circuit. In one embodiment, the leakage current is calculated using an equation having eight components. Four of these represent the leakage current arising from N-type transistors in the circuit and the other four represent the leakage current arising from P-type transistors in the circuit.

8 Claims, 1 Drawing Sheet

SIMULATION-BASED METHOD FOR ESTIMATING LEAKAGE CURRENTS IN DEFECT-FREE INTEGRATED CIRCUITS

FIELD OF THE INVENTION

The present invention relates to integrated circuit testing, and more particularly, to a method for estimating the leakage current that should be observed when a properly manufactured integrated circuit is tested.

BACKGROUND OF THE INVENTION

After fabrication, integrated circuits (ICs) are routinely tested to determine if the circuits are free of defects. The tester "exercises" the integrated circuit by applying various combinations of signals to the inputs of the IC while observing the outputs generated by these test signals. Each set of input signals is typically referred to as a "test vector".

One method for detecting defects in integrated circuits is to measure the current drawn from the power source when each test vector is applied to the IC. The current drawn from the power source after the test vector has been applied and held for a sufficient period of time for the IC to have completed any switching caused by the test vector is referred to as the quiescent, or leakage, current and denoted $I_{DDQ}$. In prior art testing systems, an IC having a measured $I_{DDQ}$ that is greater than a predetermined threshold, independent of the test vector, is rejected.

The use of a single current threshold as a pass/fail limit for $I_{DDQ}$ tests is proving to be a poor technique as CMOS process geometries shrink to the realm where normal $I_{DDQ}$ values are dominated by leakage currents, which can be significantly larger than some, or most, defect currents. These leakage currents are due to sub-threshold leakage mechanisms and reverse biased junction leakage mechanisms, although the relative contribution of the latter is becoming smaller and smaller. Both of these mechanisms are characterized by being state-dependent. Hence, an IC will pass a test based on a set of $I_{DDQ}$ test vectors only if the single pass/fail threshold is set high enough to account for the state with the most leakage.

If the threshold is set too high, chips with defects that are active in one of the test states that selects a portion of the IC with naturally lower leakage will still pass the $I_{DDQ}$ test, leading to the shipment of defective ICs. If on the other hand, the threshold is set low enough to achieve reasonable defect screening, the threshold will be below the minimum current for some ICs, resulting in excessive yield loss by rejecting good ICs.

This problem is further exacerbated by changes in leakage current which occur as the IC fabrication process undergoes normal drift. There is always a range of allowable channel lengths (Leff), and ICs produced with small values of Leff have much higher leakage than those with a longer Leff. This makes it very difficult, if not impossible, to have a single threshold which will work adequately for any given IC across the range of normal process variations.

In principle, the above-described problems can be overcome by utilizing a different threshold value for each test vector. These thresholds would reflect the different $I_{DDQ}$ currents that arise from the different states induced by each test vector. The exact value of the individual current thresholds could be established by characterizing ICs that are known to be defect-free from other tests. However, this approach assumes that sufficient good ICs have been produced and that the process does not drift with time.

In principle, detailed simulations can also determine the threshold values. For example, the chip can be simulated using SPICE for each possible test vector. The computational time for providing such a simulation is prohibitive. Alternatively, precharacterized cell information for each standard cell in the chip can be generated using a logic simulator. The leakage currents of the cells would be characterized in detail using SPICE, and this information could then be combined with the circuit state information from logic simulation to calculate an expected value for $I_{DDQ}$. For a typical standard cell library, this approach requires a large amount of characterization data to be stored. Further, the method suffers from a lack of flexibility in being able to adjust estimates based on possible process shifts as well as requiring additional characterization of any custom cells.

Broadly, it is the object of the present invention to provide an improved method for estimating the leakage currents for various test vectors.

It is a further object of the present invention to provide a method for estimating leakage current that does not require detailed SPICE simulations of the entire integrated circuit.

It is a still further object of the present invention to provide a method for estimating the leakage currents that does not require detailed leakage current data to be stored for all of the standard cells in a design library.

These and other objects of the present invention will become apparent to those skilled in the art from the following detailed description of the invention and the accompanying drawings.

SUMMARY OF THE INVENTION

Figure 1:
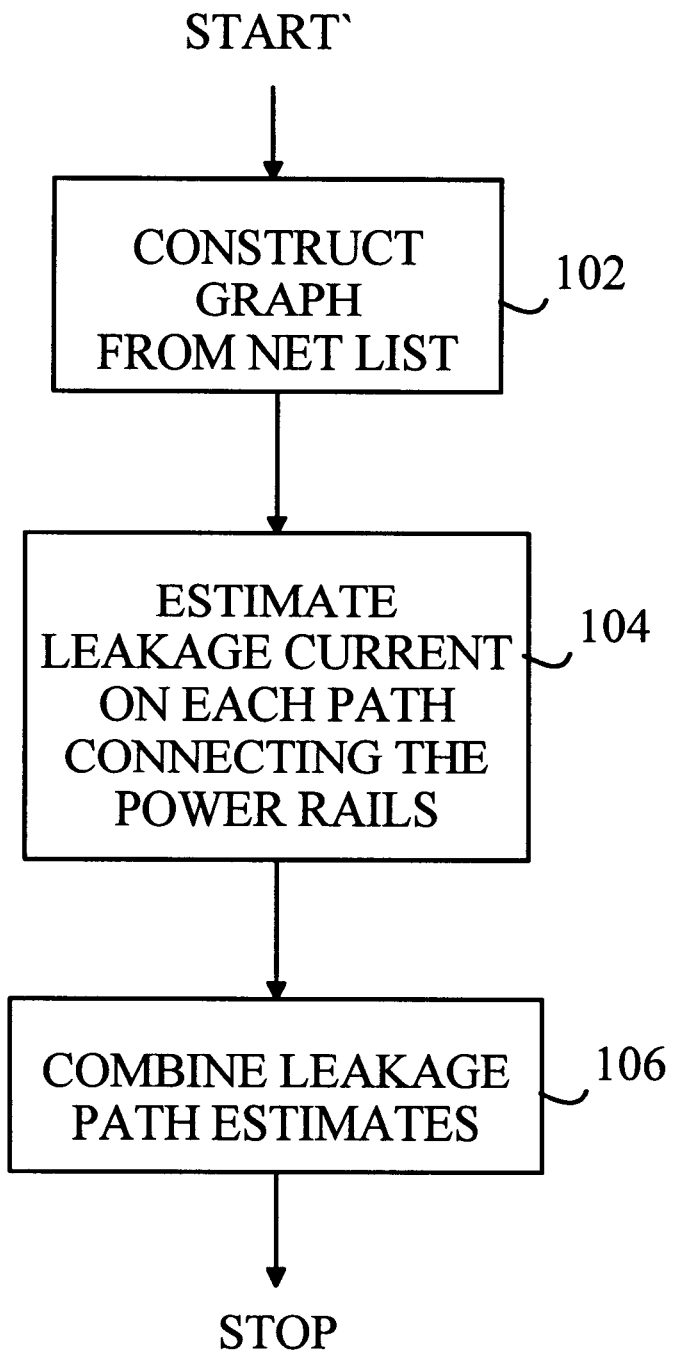
FIG. 1 is a flow chart of the preferred embodiment of the present invention.

The present invention is a method for operating a data processing system to provide an estimate of the leakage current expected from an integrated circuit that includes a plurality of N and P type transistors. Each transistor has a conducting and non-conducting state determined by a signal present on the gate of the transistor. The resistance of a transistor in each state is characterized by the size of that transistor, together with a multiplying factor used to calculate current. The method estimates the leakage current expected when the integrated circuit is connected to a testing circuit that applies specified test signals to the integrated circuit. The method generates a graph having a plurality of vertices connected by edges. Each edge represents a source-drain connected transistor connected between two nodes as a switch having an on resistance that is proportional to the size of the transistor. The state of the switch (on or off) is determined by the value of the gate node of that transistor. The graph having a first node connected to a terminal maintained at a first power supply potential and a second node connected to a terminal maintained at a second power supply potential, the difference of the first and second power supply potentials being denoted by $V_{DD}$. Each node in the graph is assigned a value of 0 or 1, together with the strength of that value, the nodes connected to the first power supply being assigned a potential of $V_{DD}$ and the nodes connected to the second power supply being assigned a potential of 0. During this assignment process, checks are carried out to ensure that the integrated circuit is in a valid state for all values of the applied signals and therefore the circuit is static-current compliant. A leakage current estimate is generated for each path connecting the first and second root nodes through non-conducting transistors, and estimates are combined to arrive at the estimate for the integrated circuit. In one embodiment of the invention, the leakage current is computed from an equation having eight components. Four of these represent the leakage current arising from N-type transistors in the circuit and the other four represent the leakage current arising from P-type transistors in the circuit. The first three components of each group represent the leakage currents arising from non-conducting transistors, the fourth represents the P-N diode leakage currents from the source and drain nodes of the transistors. The manner in which the present invention operates can be more easily understood with reference to FIG. 1, which is a flow chart of the preferred embodiment of the present invention. The present invention estimates the leakage current expected from an integrated circuit when the circuit is connected to a testing circuit that provides test signals to the circuit. The circuit has a plurality of N and P type transistors. Each transistor has a conducting and non-conducting state determined by a signal present on the gate of said transistor. The non-conducting state is characterized by the size of the transistor. The method starts by generating a graph as shown at 100. The graph includes a plurality of vertices connected by edges. Each edge representing a source-drain connected transistor connected between two nodes. The transistor is approximated as a switch having a resistance that depends on whether said transistor is "on" or "off". The graph has first and second nodes connected to terminals at different power supply potentials. Each node in the graph is a value of 0 or 1, together with the strength of that value by a logic simulator. A leakage current estimate is then generated for each path connecting the first and second nodes as shown at 102. Finally, the leakage current estimates are combined to arrive at the estimate of the leakage current of the integrated circuit as shown at 104. The three components representing, respectively, the leakage current for non-conducting transistors with $V_{DS}=V_{DD}$, the leakage for non-conducting transistors with $V_{DS}=(V_{DD}-V_t)$, and the leakage currents through source-drain connected transistor groupings having a potential difference of at least $(V_{DD}-V_t)$, across the group and having at least one node that is floating. Here, $V_t$ is the threshold voltage of the transistor type (P or N) under consideration and $V_{DS}$ is the voltage between the drain and source nodes of that transistor.

DETAILED DESCRIPTION OF THE INVENTION

The present invention gains its advantages by using a switch level simulator to determine the configurations of conducting and non-conducting transistors in the IC for each test vector. The leakage current is then estimated by a model based on this configuration information. The method avoids any characterization requirement and is completely general. The mapping of transistor information to leakage currents is controlled by adjustable parameters that are applied after the number of transistors in each of a small number of states is determined. If the process parameters are changed, changing the adjustable parameters can quickly generate new estimates.

The calculation is accomplished in a single pass through the circuit netlist array, which, in the majority of cases, is not dependent upon any traversal of the connectivity graph and can be done in an arbitrary order. In those cases where graph traversal is required (for series and parallel transistors), only a few locally connected elements in the graph need to be analyzed.

The present invention is based on a number of observations on the dependence of leakage currents with circuit configuration and previous circuit states. These observations are published in Maxwell and Rearick, "A Simulation-Based Method for Estimating Defect-Free IDDQ", Proc. Int. Workshop on IDDQ Testing, pp. 80–84, Nov. 6, 1997 which is hereby incorporated by reference. These observations indicate that the sub-threshold leakage current along any path from the first power supply rail ($V_{DD}$, logic value 1) to the second power supply rail (ground, logic value 0) can be characterized by determining, for any given state, into which of three different categories each non-conducting transistor is placed.

The first category of non-conducting transistors is that in which both source and drain are driven via other, conducting transistors to the power rails such that the source-drain voltage, $V_{DS}=V_{DD}$.

The second category of non-conducting transistors is that in which both source and drain are driven via other, conducting transistors to the power rails with $V_{DS}=(V_{DD}V_t)$. Here, $V_t$ is the threshold voltage of the transistor type (P or N) under consideration.

The third category of non-conducting transistors corresponds to those for which the source, drain, or both are floating. This class results from circuit configurations that include a series of two or more transistors which are source-drain connected. The exact mathematical analysis of the leakage current for such a series of transistors is more complex. Hence, the present invention treats these networks of source-drain connected transistors as a separate category and provides a reasonable estimate of leakage based on the topology of each such network. Since the number of such transistors is relatively small, errors in estimating the leakage current through these transistors does not markedly increase the overall error in the leakage current computation.

The total leakage current can be obtained by adding to the above transistor sub-threshold components the components due to the reverse-biased P-N junctions formed between the source/drain regions of a transistor and the adjacent bulk material. In the present invention the assumption is made that the width/length ratio of the gate region of a transistor correlates to the size of the source and drain regions, and therefore the size of the diodes and their corresponding leakage current component. Since the diode component of total leakage is relatively small, any errors in this assumption are manageable.

The process of estimating $I_{DDQ}$ in the method of the present invention requires that the four quantities be measured for each type (P or N) of transistor. These quantities are 1) Sub-threshold leakage for non-conducting transistors with $V_{DS}=V_{DD}$
2) Sub-threshold leakage for non-conducting transistors with $V_{DS}=(V_{DD}-V_t)$
3) Sub-threshold leakage through a series of source-drain connected transistors
4) P-N diode leakage from both source and drain nodes In the preferred embodiment of the present invention, the transistor currents, per se, are not collected. Instead, the above four quantities for both P-type and N-type transistors are combined in an equation, the eight components of which are proportional to the above quantities. Each component is computed from the total widths of the transistors and diodes in each of the above categories. The actual leakage current contributed by each type of transistor is then computed by multiplying the accumulated width by a constant that is unique for each of the eight components. These constants are determined by parametric measurement of fabricated devices.

The present invention starts from a conventional transistor level netlist description of the circuit. For any given test vector, an undirected graph whose edges represent the source-drain-connected transistors, treated as switches with discretized on-resistances, is generated. The vertices of the graph represent the nodes in the circuit and contain fields denoting the present state of the node (logic 1, 0, or X) along with the strength of the node (which indicates if the node is part of an active path to a power supply). Methods for generating such a graph are known to those skilled in the art, and hence, will not be discussed in detail here. The reader is referred to R. E. Bryant, "A Switch-Level Model and Simulator for MOS Digital Systems", IEEE Transactions on Computers, Vol. C-33, No. 2, pp. 160–177, 1984 for a more complete discussion of the generation of such graphs. This article is hereby incorporated by reference.

For the purposes of the present discussion, the value of a node is represented as an ordered pair of state and strength.. The state of a node is either 0, 1, or X. The strength of a node is an integer number between 0 and 63. Strength 0 is the weakest strength; this would be the strength of an undriven node. A node with a strength of 63 is the strongest and is representative of a node which is a power supply. In the following discussion a node value will be written as (state, strength). For example (1,63) behaves like a $V_{DD}$ supply, (0,33) is a moderately driven zero node, and (X,0) is an undriven (floating) node of unknown state.

A transistor is represented as a resistive switch controlled by the logic state of its gate. These switches are truly bi-directional in that logic levels move in both directions between the drain and the source. The switch has an on-resistance proportional to the transistor's length divided by its width. The resistance is discretized and represented as an integer number between 1 and 63 where one is the least resistance and 63 is the most resistance. There is a difference relationship between a node's strength and a transistor's resistance. For example, if a node value of (1,40) is associated with the drain of a conducting transistor with a resistance of 10, the source would have a node value of either (1,50) or (1,30).

In the present invention, a node evaluator returns the value for a target node based on the present circuit state. To do this the node evaluator searches for a driven node (power supply) connected through a conducting transistor path from the target node. The search continues until either a driven node is found or all connected nodes have been examined. The resistance through series-connected conducting transistors is simply summed in the search for a supply. When a driven node is found, the value of the target node takes the state of the driven node with a strength of 63 minus the path resistance. If conducting paths to both the $V_{DD}$ power supply and the ground power supply are found, the node takes the state of the supply with the lower resistance path, but the test vector is disqualified from the Iddq test. As a result, the invention also verifies that a given set of test vectors all place the IC in a valid static state, and hence, the IC is static-current-compliant.

In the case of equal resistance paths, the node evaluator prefers the value caused by the driven 0 over the driven 1. When no driven nodes are encountered (the floating node case), the evaluator retains the previous state of the node and reduces its strength to 0. If the path resistance to a driven node becomes greater than 63, the strength of the target node is set to 0.

The present invention utilizes this graph to identify those transistors that are subject to sub-threshold leakage. Since the resistance of a conducting transistor is orders of magnitude less than that of a non-conducting transistor, the leakage estimation step sets the resistance of a conducting transistor to zero and ignores strength values in the graph, even though these were necessary to determine the value of each node. A transistor is subject to sub-threshold leakage if the potential on its gate node of the transistor makes it non-conducting (0 for an N-type transistor and 1 for a P-type transistor ) and its drain and source nodes are at different voltages. The transistor array is processed sequentially to identify the category into which each transistor should be placed: 1) conducting (and therefore not leaking), 2) not conducting but not leaking because $V_{DS}$=0, 3) not conducting and leaking with $V_{DS}$=$V_{DD}$, 4) not conducting and leaking with $V_{DS}$=($V_{DD}$-$V_t$), or 5) not conducting and leaking through a floating node or nodes. Categories 1) and 2) do not add to the leakage current and are ignored, the width of transistors in categories 3) and 4) are accumulated separately for the respective types (N or P), and transistors in category 5) require additional analysis.

This fifth category corresponds to the case in which a transistor is non-conducting, its source or drain is driven to a logic value of 0 or 1, and the other of its source or drain is floating. In this case, the algorithm must determine if there is a source-drain connected path from this floating node to a node driven to the opposite logic value from the driven node of the transistor under consideration. If such a path exists then there is leakage through this path. A depth-first-search routine is used for this purpose. During the course of the traversal of each path from the first driven node, a width is computed to represent the transistor string connecting this driven node to a node driven to the opposite state. The widths of the series transistors traversed along each path connecting these two nodes are combined using the inverse-of-the-sum-of-the-reciprocals method (as conductance is reduced by series transistors), and conducting transistors are treated as wires. This replaces each string of transistors connected to the nodes by their equivalent width. If there is more than one parallel path connecting the two nodes, the equivalent widths computed for each path are added, since width is proportional to conductance, which is increased by parallel transistors. The width of this equivalent transistor is then added to the cumulated width for the fifth category of transistors discussed above.

The above described algorithm is summarized by the following pseudocode:

```
{
  G) Is the gate of the transistor a logic 0?
     -> Yes :then this transistor could be leaking
        Are source and drain driven to opposite logic values?
        -> Yes :then this transistor is leaking
           Is there a s-d path through conducting pfets between the
           node driven to logic 1 and the VDD supply?
              -> Yes :then this could be full Vds = Vdd leakage
                 Is there a s-d path through conducting nfets between the
                 node driven to logic 0 and the GND supply?
                    -> Yes :full Vds = Vdd subthreshold leakage
                       ==> add the width of the transistor to the
                           N leakage width total
                    -> No :reduced Vds = Vdd - Vt subthreshold leakage
                       ==> add the width of the transistor to the
                           low__Vds N leakage width total
              -> No :reduced Vds = Vdd - Vt subthreshold leakage
                 ==> add the width of the transistor to the
                     low__Vds N leakage width total
        -> No :then this transistor may be leaking
           Are source and drain driven to the same logic value?
           -> Yes :then this transistor is not leaking
```

-continued

```
        -> No :then this transistor may be leaking
           Are source and drain both floating?
             -> Yes :then this transistor can be skipped
             -> No :then this transistor may be leaking
               Is either the source or drain driven to logic 1?
                 -> Yes :then this transistor may be leaking
                   Is there a s-d path through the graph to logic 0?
                     -> Yes :then this transistor is leaking
                       ==> add the accumulated widths of the series
                           transistors in the path to the
                           series N leakage width total
                     -> No :then this transistor is not leaking
                 -> No :then this transistor can be skipped
       -> No :then this transistor is not experience subthreshold leakage
    S) Is the source of the transistor a logic 1?
       -> Yes :then the source is leaking via the diode to substrate
         ==> add the width of the transistor to the N diode width total
       -> No :then the source is not leaking via the diode to substrate
    D) Is the drain of the transistor a logic 1?
       -> Yes :then the drain is leaking via the diode to substrate
         ==> add the width of the transistor to the N diode width total
       -> No :then the drain is not leaking via the diode to substrate
}
If the transistor is P-type:
{
    G) Is the gate of the transistor a logic 1?
       -> Yes :then this transistor could be leaking
          Are source and drain driven to opposite logic values ?
            -> Yes :then this transistor is leaking
              Is there a s-d path through conducting pfets between the
              node driven to logic 1 and the VDD supply?
                -> Yes :then this could be full Vds = Vdd leakage
                  Is there a s-d path through conducting nfets between the
                  node driven to logic 0 and the GND supply?
                    -> Yes :full Vds = Vdd subthreshold leakage
                      ==> add the width of the transistor to the
                          P leakage width total
                    -> No :reduced Vds = Vdd - Vt subthreshold leakage
                      ==> add the width of the transistor to the
                          low__Vds P leakage width total
                -> No :reduced Vds = Vdd - Vt subthreshold leakage
                  ==> add the width of the transistor to the
                      low__Vds P leakage width total
            -> No :then this transistor may be leaking
               Are source and drain driven to the same logic value?
                 -> Yes :then this transistor is not leaking
                 -> No :then this transistor may be leaking
                   Are source and drain both floating?
                     -> Yes :then this transistor can be skipped
                     -> No :then this transistor may be leaking
                   Is either the source or drain driven to logic 1?
                     -> Yes :then this transistor may be leaking
                       Is there a s-d path through the graph to logic 0?
                         -> Yes :then this transistor is leaking
                           ==> add the accumulated widths of the series
                               transistors in the path to the
                               series P leakage width total
                         -> No :then this transistor is not leaking
                     -> No :then this transistor can be skipped
           -> No :then this transistor is not experience subthreshold leakage
    S) Is the source of the transistor a logic 0?
       -> Yes :then the source is leaking via the diode to N-well
         ==> add the width of the transistor to the P diode width total
       -> No :then the source is not leaking via the diode to N-well
    D) Is the drain of the transistor a logic 0?
       -> Yes :then the drain is leaking via the diode to N-well
         ==> add the width of the transistor to the P diode width total
       -> No :then the drain is not leaking via the diode to N-well
}
```

As noted above, embodiments of the present invention in which the actual leakage currents through the eight types of components are accumulated instead of the transistor widths can be practiced without deviating from the teachings of the present invention. In this case, each transistor's width is multiplied by the appropriate constant to convert the width to a current at the time the transistor is traversed in the search. If, however, one of the constants changes because of changes in the fabrication process, the resulting leakage current estimates would need to be updated. To perform the update, the constants that were originally used and the contribution of each type of component would need to be saved. Hence, such an embodiment requires more computation and no less storage.

The present invention can be practiced on any general purpose data processing system. However, computational platforms having specialized hardware for accelerating the computations may also be utilized.

Various modifications to the present invention will become apparent to those skilled in the art from the foregoing description and accompanying drawings. Accordingly, the present invention is to be limited solely by the scope of the following claims.

What is claimed is:

1. A method for operating a data processing system to provide an estimate of the leakage current expected from an integrated circuit comprising a plurality of N and P type transistors, each of said transistors having a conducting and non-conducting state determined by a signal present on the gate of said transistor, said non-conducting state being characterized by the size of said transistor, said method estimating the leakage current expected when said integrated circuit is connected to a testing circuit, said testing circuit providing test signals to said integrated circuit, said method comprising the steps of:

generating a graph comprising a plurality of vertices connected by edges, each edge representing a source-drain connected transistor connected between two nodes as a switch having a resistance that depends on whether said transistor is "on" or "off" when said test signals are present, said graph having a first node connected to a terminal maintained at a first power supply potential and a second node connected to a terminal maintained at a second power supply potential, the difference of said first and second power supply potentials being denoted by $V_{DD}$, each node in said graph being assigned, using logic simulation, a value of 0 or 1, together with the strength of that value, said nodes connected to said first power supply being assigned a value of 1 and a maximum strength value and said nodes connected to said second power supply being assigned a value of 0 and a maximum strength value;

generating a leakage current estimate for each path connecting said first and second nodes; and combining said leakage current estimates to arrive at said estimate of the leakage current of said integrated circuit, wherein said step of generating a leakage current estimate for each path connecting said first and second nodes comprises the step of:

setting said leakage current estimate for one of said paths equal to the leakage current through a non-conducting transistor having a potential difference between the source and drain thereof, referred to as $V_{DS}$, such that $V_{DS}=V_{DD}$ if that path contains such a transistor, said leakage current depending on $V_{DS}$, said type of transistor, and the size of said transistor.

2. The method of claim 1 wherein said step of generating a leakage current estimate for each path connecting said first and second nodes further comprises the step of:

setting said leakage current estimate for one of said paths equal to the leakage current through a non-conducting transistor having a potential difference between the source and drain thereof, referred to as $V_{DS}$, such that $V_{DS}=(V_{DD}-V_t)$ if that path contains such a transistor, said leakage current depending on $V_{DS}$, said type of transistor, and the size of said transistor, $V_t$ being the threshold voltage of the transistor under consideration.

3. The method of claim 1 wherein said step of generating a leakage current estimate for each path connecting said first and second nodes further comprises the step of:

setting the leakage current estimate for one of said paths equal to the leakage current through a path having a plurality of non-conducting transistors on that path, if that path connects a node at a potential of $V_{DD}$ to a node at a potential of 0 and that path contains one node that is assigned, based on its having the minimum strength value, a potential of undefined, said leakage current depending on said type of transistors and the equivalent size of the non-conducting transistors in the network.

4. The method of claim 3 wherein said step of generating a leakage current estimate for each path connecting said first and second nodes further comprises the steps of:

computing a first diode leakage current estimate for each P-type transistor on said path having a source or drain at a value of 0; and computing a second diode leakage current estimate for each N-type transistor on said path having a source or drain at a value of 1.

5. A method for operating a data processing system to provide an estimate of the leakage current expected from an integrated circuit comprising a plurality of N and P type transistors, each of said transistors having a conducting and non-conducting state determined by a signal present on the gate of said transistor, said non-conducting state being characterized by the size of said transistor, said method estimating the leakage current expected when said integrated circuit is connected to a testing circuit, said testing circuit providing test signals to said integrated circuit, said method comprising the steps of:

generating a graph comprising a plurality of vertices connected by edges, each edge representing a source-drain connected transistor connected between two nodes as a switch having a resistance that depends on whether said transistor is "on" or "off" when said test signals are present, said graph having a first node connected to a terminal maintained at a first power supply potential and a second node connected to a terminal maintained at a second power supply potential, the difference of said first and second power supply potentials being denoted by $V_{DD}$, each node in said graph being assigned, using logic simulation, a value of 0 or 1, together with the strength of that value, said nodes connected to said first power supply being assigned a value of 1 and a maximum strength value and said nodes connected to said second power supply being assigned a value of 0 and a maximum strength value;

generating a leakage current estimate for each path connecting said first and second nodes; and combining said leakage current estimates to arrive at said estimate of the leakage current of said integrated circuit, wherein said steps of generating a leakage current estimate for each path and combining said leakage current estimates comprise:

generating parameters of an equation, the sum of whose components being the estimated leakage current, said equation comprising a first P-type transistor component and a first N-type transistor component, said first P-type transistor component representing leakage current from transistors having a non-conducting state, said leakage current being proportional to the sum of all of the leakage currents through P-type transistors in said integrated circuits having a potential difference of $V_{DD}$ between the source and drains thereof, and said first N-type transistor component representing leakage current from transistors having a non-conducting state, said leakage current being proportional to the sum of all of the leakage currents through N-type transistors in said integrated circuits having a potential difference of $V_{DD}$ between the source and drains thereof.

6. The method of claim 5 wherein said equation further comprises a second P-type transistor component and a second N-type transistor component, said second P-type transistor component representing leakage current from transistors having a non-conducting state in which said leakage current being proportional to the sum of all of the leakage currents through P-type transistors in said integrated circuits having a potential difference of $(V_{DD}-V_t)$t between the source and drains thereof, and said second N-type transistor component representing leakage current from transistors having a non-conducting state in which said leakage current being proportional to the sum of all of the leakage currents through N-type transistors in said integrated circuits having a potential difference of $(V_{DD}-V_t)$ between the source and drains thereof.

7. The method of claim 5 wherein said equation further comprises a third P-type transistor component and a third N-type transistor component, said third P-type transistor component representing leakage current from transistors having a non-conducting state in which said leakage current being proportional to the sum of all of the leakage currents through source-drain series-connected P-type transistors in said integrated circuits on each path having a plurality of non-conducting transistors on that path, if that path connects a node at a potential of $V_{DD}$ to a node at a potential of 0 and that path contains at least one node that is assigned a potential of undefined, and said third N-type transistor component representing leakage current from transistors having a non-conducting state in which said leakage current being proportional to the sum of all of the leakage currents through source-drain series-connected N-type transistors in said integrated circuits on each path having a plurality of non-conducting transistors on that path, if that path connects a node at a potential of $V_{DD}$ to a node at a potential of 0 and that path contains at least one node that is assigned a potential of undefined.

8. The method of claim 5 wherein said equation further comprises a P-N diode component and a N-P diode component, said P-N diode component representing leakage current from diodes, said leakage current being equal to the sun of the diode leakage currents of all P-type transistors having a source and/or drain at a value of 0 in said integrated circuit, and said N-P diode component representing leakage current from diodes, said leakage current being equal to the sum of the diode leakage currents of all N-type transistors having a source and/or drain at a value of 1 in said integrated circuit.

* * * * *